(12) United States Patent
Tanaka et al.

(10) Patent No.: US 7,196,905 B2
(45) Date of Patent: Mar. 27, 2007

(54) HEAT RADIATING APPARATUS OF ELECTRONIC COMPONENT

(75) Inventors: Hironori Tanaka, Yokohama (JP);
Yoshiyuki Sato, Yokohama (JP);
Wataru Takano, Yokohama (JP);
Hideki Zenitani, Yokohama (JP);
Mituaki Hayashi, Yokohama (JP);
Kazuya Nishida, Yokohama (JP);
Katsuhiko Ikeda, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 2 days.

(21) Appl. No.: 11/044,629

(22) Filed: Jan. 27, 2005

(65) Prior Publication Data

US 2005/0185384 A1 Aug. 25, 2005

Related U.S. Application Data

(63) Continuation of application No. PCT/JP02/13850, filed on Dec. 27, 2002.

(51) Int. Cl.
*H05K 7/20* (2006.01)
*F28F 7/00* (2006.01)
*H01L 23/34* (2006.01)

(52) U.S. Cl. ............... 361/704; 165/80.3; 165/185; 257/719

(58) Field of Classification Search ........... 361/704
See application file for complete search history.

(56) References Cited

U.S. PATENT DOCUMENTS 5,375,652 A  12/1994  Matsunaga et al.
5,566,052 A * 10/1996  Hughes ............... 361/704
5,708,564 A *  1/1998  Lin ..................... 361/704

FOREIGN PATENT DOCUMENTS

| JP | 4-264760 | 9/1992 |
| JP | 4-284654 | 10/1992 |
| JP | 6-196883 | 7/1994 |
| JP | 9-298259 | 11/1997 |

OTHER PUBLICATIONS

International Search Report dated Apr. 15, 2003.

* cited by examiner

*Primary Examiner*—Greg Thompson
(74) *Attorney, Agent, or Firm*—Katten Muchin Rosenman LLP

(57) ABSTRACT

A heat radiating apparatus includes a radiator adhering to an electronic component mounted on a circuit board via an elastic member provided on the circuit board so that the electronic component is cooled. The radiator includes a plurality of projection parts, the elastic member includes an engaging part configured to engage the projection part and a radiator insert hole forming part where the radiator is inserted, and a pushing force is applied from the elastic member to the radiator by rotating the radiator so that the projection part is engaged by the engaging part, and thereby a bottom surface of the radiator is adhered to the electronic component.

12 Claims, 16 Drawing Sheets

FIG.12
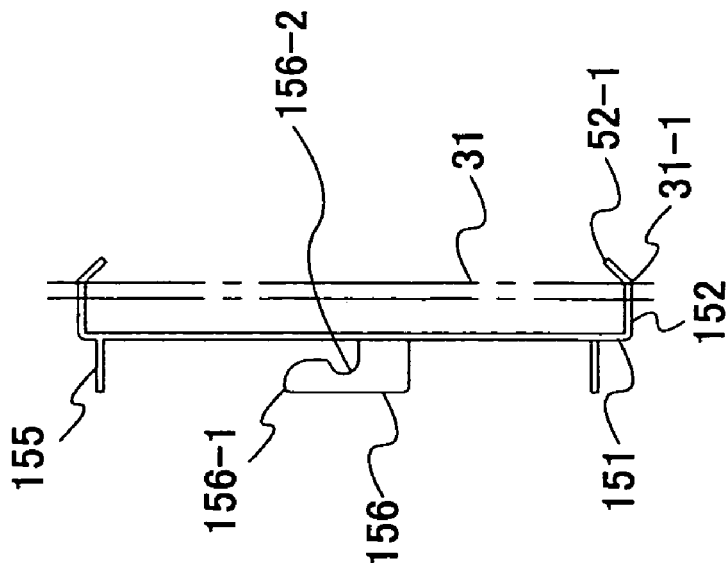
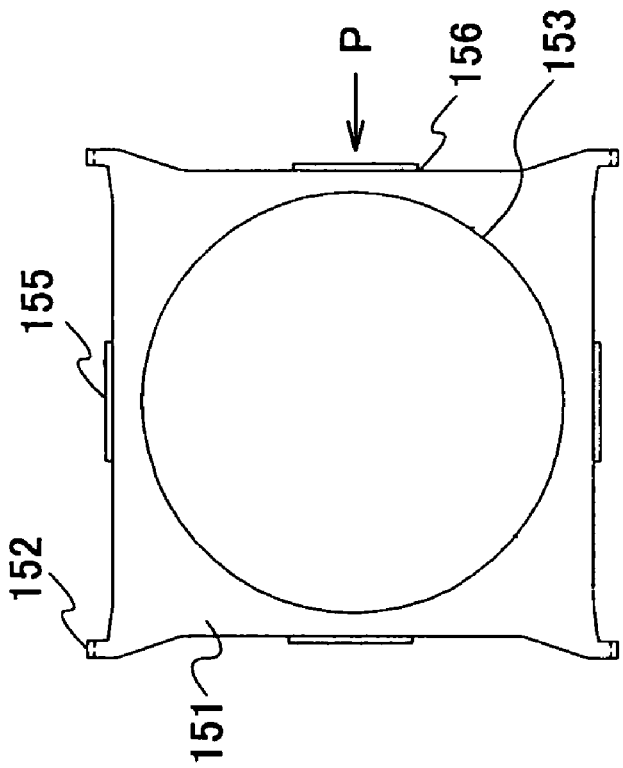

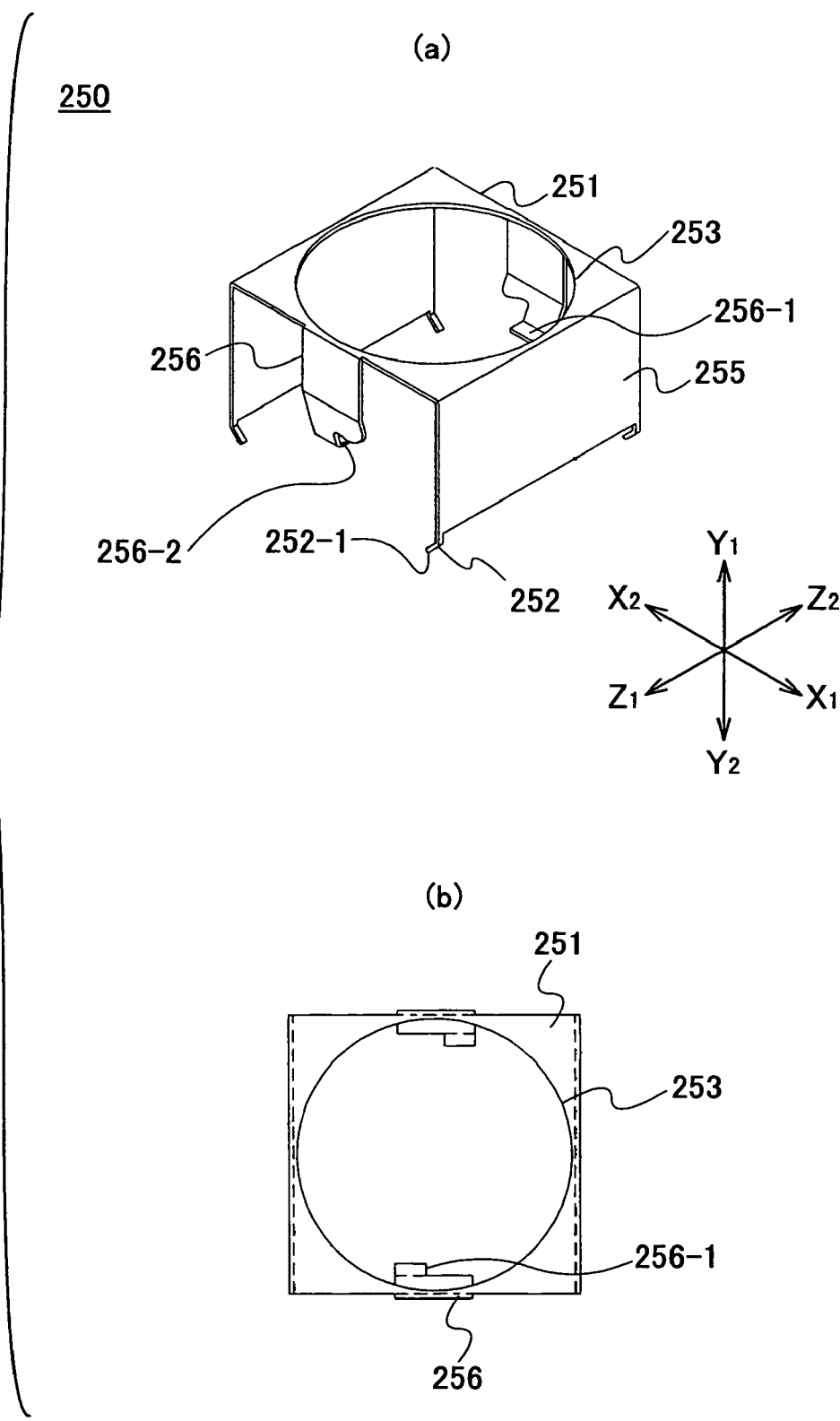

HEAT RADIATING APPARATUS OF ELECTRONIC COMPONENT

CROSS-REFERENCE TO RELATED APPLICATION

This application is a U.S. continuation application filed under 35 USC 111(a) and claiming benefit under 35 USC 120 and 365(c) of PCT Application No. JP2002/013850 filed on Dec. 27, 2002. The foregoing application is hereby incorporated by reference.

BACKGROUND OF THE INVENTION

1. Field of the Invention

The present invention generally relates to heat radiating apparatuses for electronic components, and more particularly, to a heat radiating apparatus of an electronic component such as a semiconductor device mounted on a circuit board.

2. Description of the Related Art

An electronic component such as a semiconductor device, like a large scale integration circuit (LSI) or a field programmable gate array (FPGA), is mounted on a circuit board installed in an electronic device such as an information communication device. Such an electronic device is connected to a related device via an optical fiber or the like so that a high speed information transmission and a large amount information transmission are accomplished.

Because of this, the number of components such as the semiconductor device mounted on the circuit board, the optical fiber, a cable, and others is increasing. It is required to mount these components on the circuit board at a high density.

Meanwhile, consumption of electric power in the above-mentioned semiconductor device is increasing as the operating speed of the semiconductor device is being made higher. Hence, a radiator for radiating heat from a surface of the semiconductor device is mounted on the semiconductor device so as to satisfy a junction allowable temperature of the semiconductor device. Since it is required to mount the components on the circuit board at high density as described above, it is desirable that even the radiators be mounted at a space savings.

FIG. 1 is a view showing a conventional radiating apparatus of the semiconductor device. More specifically, FIG. 1-(a) is a plan view of the radiator and FIG. 1-(b) is a side view seen from a direction shown by an arrow A in FIG. 1-(a). See Japan Laid-Open Patent Application No. 6-196883. Referring to FIG. 1, a radiating apparatus 10 includes a radiator 11 and a fixing spring metal fitting 12.

FIG. 2 is a side view of the radiator 11 of the radiating device 10 shown in FIG. 1, seen from a direction shown by an arrow A in FIG. 1-(a). As shown in FIG. 2, the radiator 11 has plural disk-shaped heat radiating fins 11-1 and a cylindrical stud section 11-2. A circumferential groove 11-3 is provided about the circumference of the stud section 11-2 near an end thereof.

As shown in FIG. 1, the fixing spring metal fitting 12 has a spring property and comprises an intermediate piece 12-1 occupying the flat portion and bent pieces 12-2. The bent pieces 12-2 are bent so that the intermediate piece 12-1 overlies the semiconductor device 14 mounted on the circuit board 13 in a generally inverted U shape. The bent pieces 12-2 are inserted into through holes 13-1 so as to be fixed to the circuit board 13.

At the center of the intermediate piece 12-1, a transversely extending, open ended notch 15 is disposed which engages the circumferential groove 11-2 of the radiator 11. The notch 15 comprises an opening portion 15-1 with a width equal to the diameter of the circumferential groove 11-2 of the radiator 11, a semi-circular innermost portion 15-3 with a diameter equal to the diameter of the circumferential groove 11-2 of the radiator 11, and a straight intermediate portion 15-2 connecting the opening portion 15-1 to the innermost portion 15-3. A slot 16 is formed in the intermediate piece 12-1 about the notch 15 so as to surround the notch 15, so that the intermediate piece 12-1 can be deflected vertically (in the up and down direction in FIG. 1-(a)).

Next, the assembly procedure of the heat radiating apparatus 10 is described. The radiator 11 is fixed by the fixing spring metal fitting 12 as follows.

First, the semiconductor device 14 is mounted and fixed to the circuit board 13. The fixing spring metal fitting 12 is mounted to the circuit board 13 so as to overlie the semiconductor device 14. The bent pieces 12-2 are inserted into the through holes 13-1 of the circuit board 13 and bend-fixed or solder-fixed to the circuit board 13 at a position where an inside of the fixing spring metal fitting 12 and a surface of the semiconductor device 14 are mutually opposed.

Then, the circumferential groove 11-3 of the radiator 11 is aligned with the notch 15 of the fixing spring metal fitting 12, and the radiator 11 is slid in a horizontal direction, namely in the left-right direction in FIG. 1-(a), to the central portion of the fixing spring metal fitting 12 from the side. At this time, the end surface of the stud section 11-2 of the radiator 11 goes into a space between the fixing spring metal fitting 12 and the semiconductor device 14. The end surface of the stud section 11-2 of the radiator 11 is in tight contact with and fixed to a top surface of the semiconductor device 14 due to the resiliency of the fixing spring metal fitting 12, thereby heat generated inside of the semiconductor device 14 is radiated by the radiator 11.

However, the above-discussed radiating apparatus 10 has the following problems. More specifically, FIG. 3-(a) is a perspective view of the radiating apparatus 10 and FIG. 3-(b) is a view seen from a direction shown by an arrow B in FIG. 3-(a).

As shown in FIG. 3, in a case where other components such as an optical fiber 17 and circuit elements 18-1 and 18-2 are mounted on the circuit board 13 in a direction in which the radiator 11 is moved, when it is tried to remove the radiator 11 from the fixing spring metal fitting 12 via the opening portion 15-1 of the notch 15 in a direction shown by arrow C, as shown by dotted lines in FIG. 3-(b), the optical fiber 17 and circuit elements 18-1 and 18-2 interfere with the radiator 11. Therefore, it is necessary to move the optical fiber 17 and circuit elements 18-1 and 18-2 in advance before the radiator 11 is removed.

Furthermore, the radiator 11 is installed in the fixing spring metal fitting 12 by putting the radiator 11 in the notch 15 in a horizontal direction, namely from a left to right direction in FIG. 1-(a). Therefore, it is necessary to provide an area within a diameter of the radiating fins 11-1, namely approximately 30 through 40 mm, for installation and removal of the radiator 11. This creates an obstacle to high density mounting of the components on the circuit board.

In addition, in a case where plural electronic components, to which the radiator 11 is required to be mounted, are mounted on the circuit board 13 by placing the electronic components close to each other, in the conventional radiating apparatus 10, there is a limitation in order to provide for the installation and removal of the radiator 11. For example, in a case where wiring of the optical fiber 17 is required so as to wind around and surround the radiator 11 in order to efficiently secure the area where the electronic components are mounted, it is necessary to mount the radiator 11 on the circuit board 13 before the optical fiber 17 is mounted on the circuit board 13.

Furthermore, the radiator 11 itself reaches a high temperature during the operation of the electronic device. Therefore, for example, when a cable such as the optical fiber 17 comes in contact with the radiator 11, the surface of the optical fiber 17 may be damaged. As a result of this, a signal may not be transmitted in the optical fiber 17 normally and thereby bad operations of the electronic device may happen.

Meanwhile, the circumferential groove 11-3 is formed in the radiator 11 so that the radiator 11 is engaged with the fixing spring metal fitting 12. However, the diameter of the stud section 11-2 where the circumferential groove 11-3 is formed in the radiator 11 is small. Hence, thermal conductivity in this part is not good and therefore the radiation effect of the radiator 11 may be an obstacle.

In addition, in the conventional structure, since the force of the fixing spring metal fitting 12 is not applied to the radiator 11 evenly, the thermal conductivity to the radiator 11 is not always good.

Furthermore, in a case where the semiconductor device 14 or the like does not work well, it is required to be able to easily check information indicated on a surface of the semiconductor device 14, such as the manufactures, the type, or the like. However, in the conventional structure, since the area of a notch formed by the notches 15-1 through 15-3 provided for installing the radiator 11 in the fixing spring metal fitting 12 is small, the above-mentioned information indicated on the surface of the semiconductor device 14 may not be always be checked in a state where the radiator 11 is removed. In this case, in order to check the information, it is necessary to remove the fixing spring metal fitting 12.

In addition, it is difficult to lift up the fixing spring metal fitting 12. Hence, it is difficult to easily remove the radiator 11 from the fixing spring metal fitting 12.

Meanwhile, Japan Laid-Open Patent Application No. 4-284654 discloses a radiating structure of a semiconductor device where a radiator is supported by a part made of a shape-memory alloy plate. However, this structure has disadvantages in that the material is limited, the structure is complicated, and the above-mentioned part does not return back to an original state and therefore the radiator cannot be removed before the temperature drops below a designated temperature.

SUMMARY OF THE INVENTION

Accordingly, it is a general object of the present invention to provide a novel and useful heat radiating apparatus for an electronic component, in which one or more of the problems described above are eliminated.

Another and more specific object of the present invention is to provide a heat radiating apparatus of an electronic component whereby a radiator is securely attached to an electronic component which is a subject of radiation so that heat from the electronic device can be efficiently radiated, and furthermore the radiator can be installed and removed with a simple structure.

The above object of the present invention is achieved by a heat radiating apparatus, including:

a radiator adhering to an electronic component mounted on a circuit board via an elastic member provided on the circuit board so that the electronic component is cooled;

wherein the radiator includes a plurality of projection parts, the elastic member includes an engaging part configured to engage the projection part and a radiator insert hole forming part where the radiator is inserted, and a pushing force is applied from the elastic member to the radiator by rotating the radiator so that the projection part is engaged by the engaging part, and thereby a bottom surface of the radiator is adhered to the electronic component.

Other objects, features, and advantages of the present invention will become more apparent from the following detailed description when read in conjunction with the accompanying drawings.

BRIEF DESCRIPTION OF THE DRAWINGS

FIG. 12 is a view showing a structure of a fixing spring metal fitting 150 shown in FIG. 11;

FIG. 16 is a view showing a structure of a fixing spring metal fitting 250 shown in FIG. 13.

DETAILED DESCRIPTION OF THE PREFERED EMBODIMENTS

A description is next given, with reference to FIG. 4 through FIG. 16, of embodiments of the present invention.

[First Embodiment]

Figure 1:
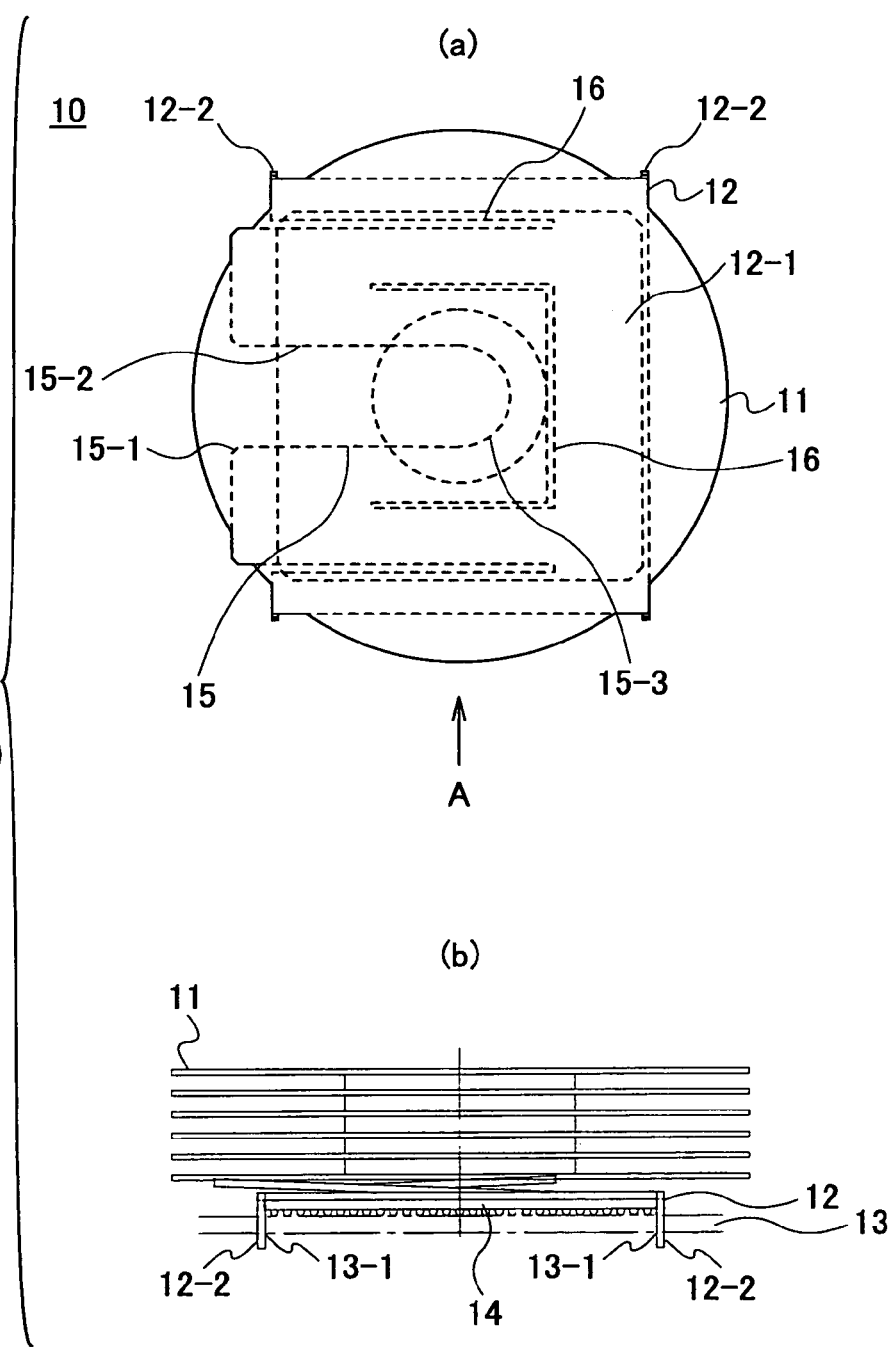
FIG. 1 is a view showing a conventional radiating apparatus of a semiconductor device.
Figure 2:
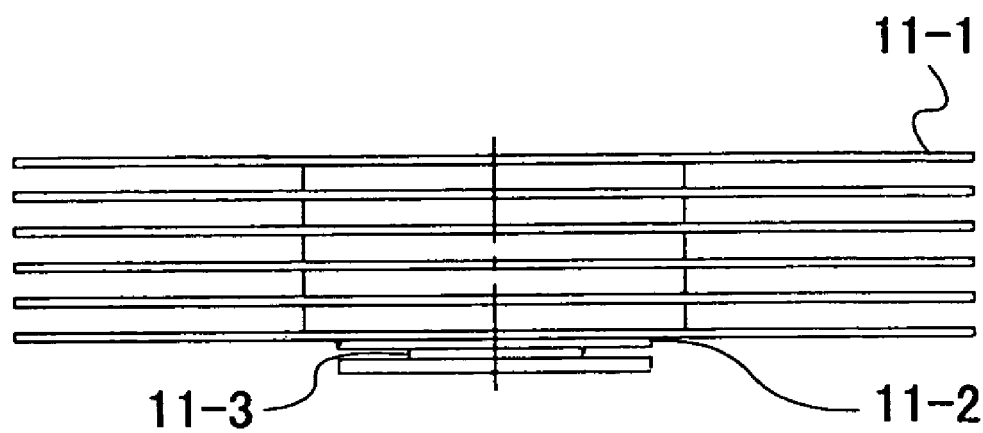
FIG. 2 is a side view of the radiator 11 of the radiating apparatus 10 shown in FIG. 1, seen from a direction shown by an arrow A in FIG. 1-(a)
Figure 3:
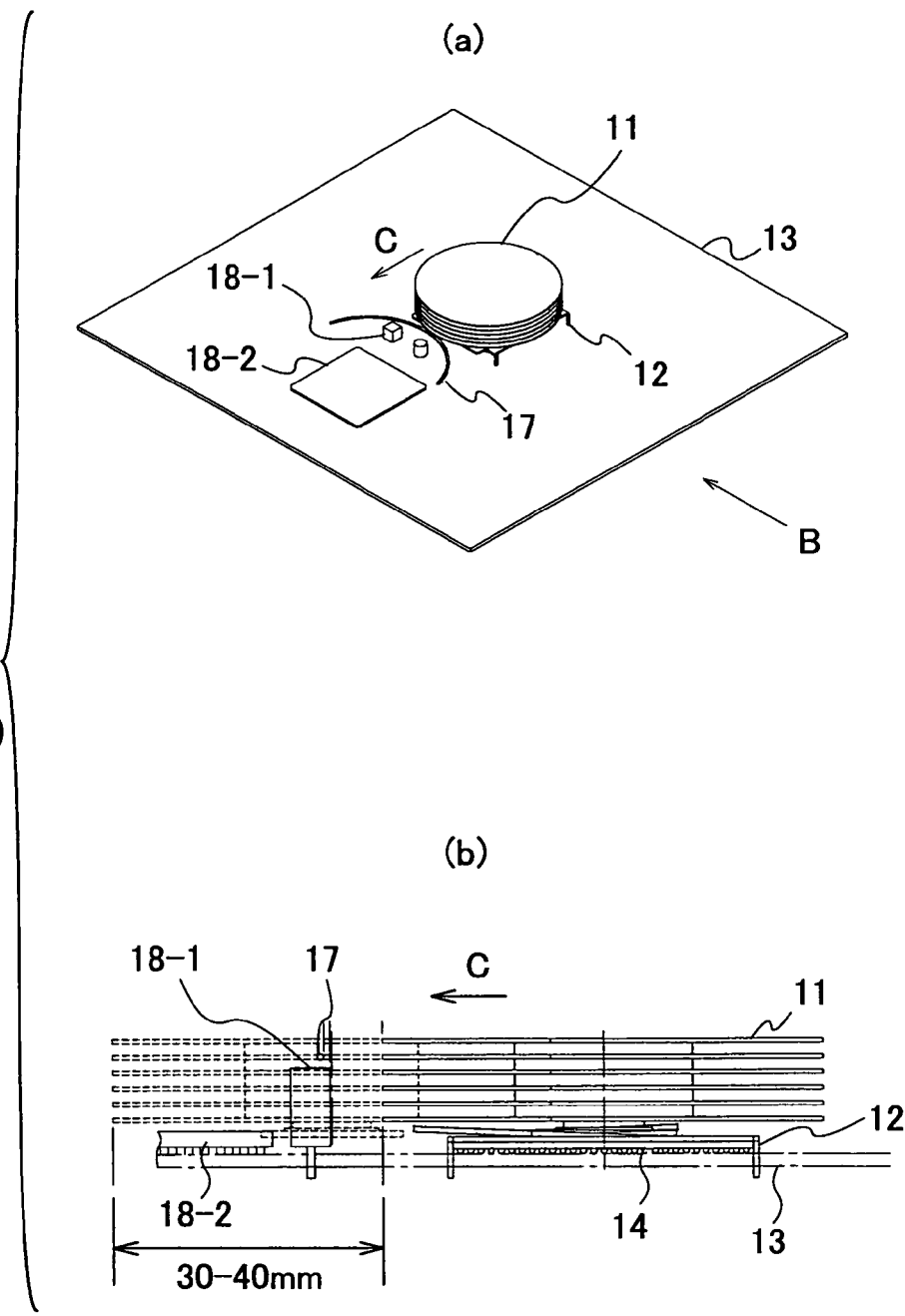
FIG. 3 is a view for explaining problems of the conventional radiating apparatus 10.
Figure 4:
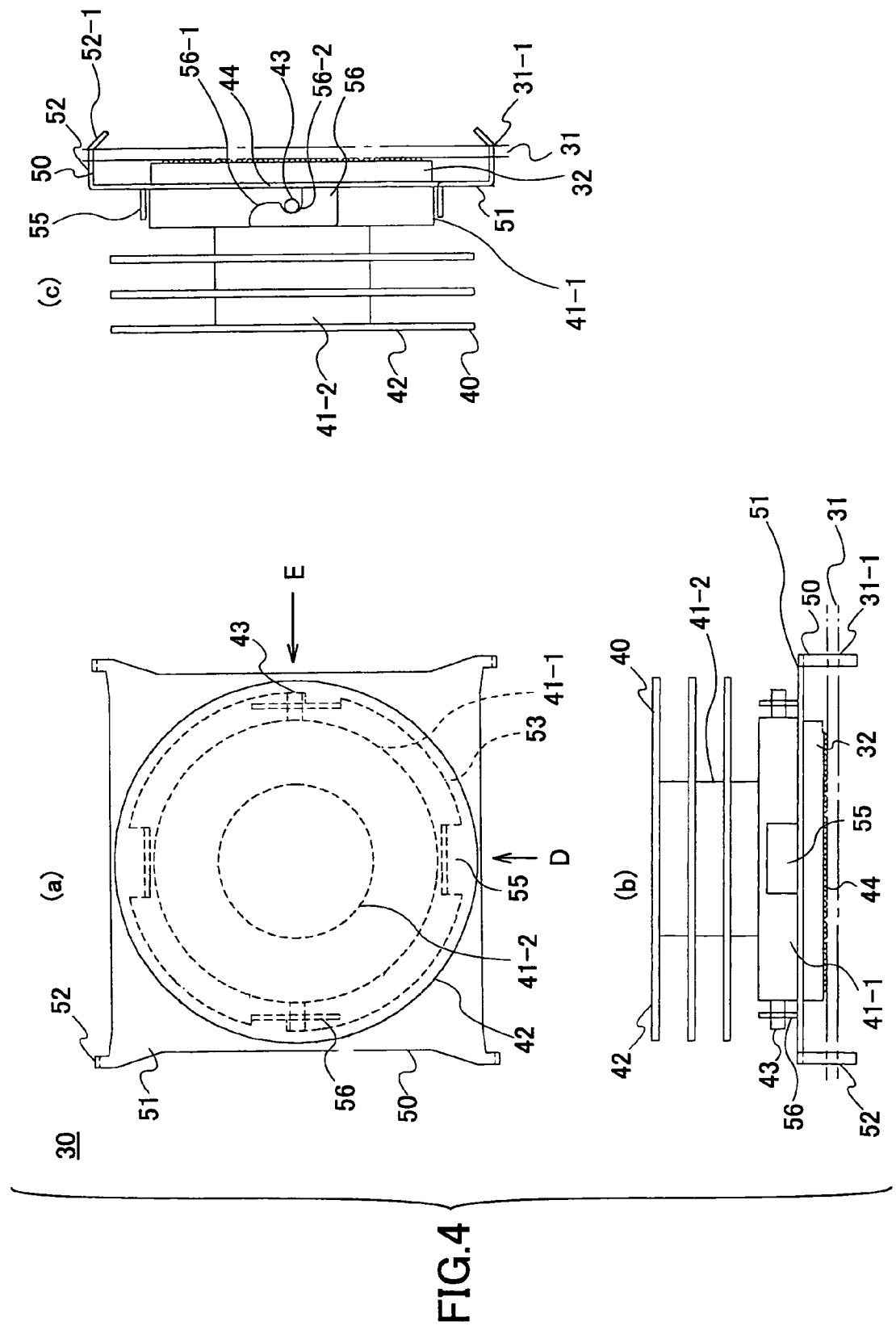
FIG. 4 is a view showing a radiating apparatus 30 of a first embodiment of the present invention.

FIG. 4 is a view showing a radiating apparatus 30 of a first embodiment of the present invention. More specifically, FIG. 4-(a) is a plan view of the radiation apparatus 30, FIG. 4-(b) is a side view seen from a direction shown by an arrow D in FIG. 4-(a), and FIG. 4-(c) is a side view seen from a direction shown by an arrow E in FIG. 4-(a).

Referring to FIG. 4, the radiating apparatus 30 of the first embodiment includes a radiator 40 and a fixing spring metal fitting 50 as an example of an elastic member. The radiator 40 is mounted on the fixing spring metal fitting 50.

Figure 5:
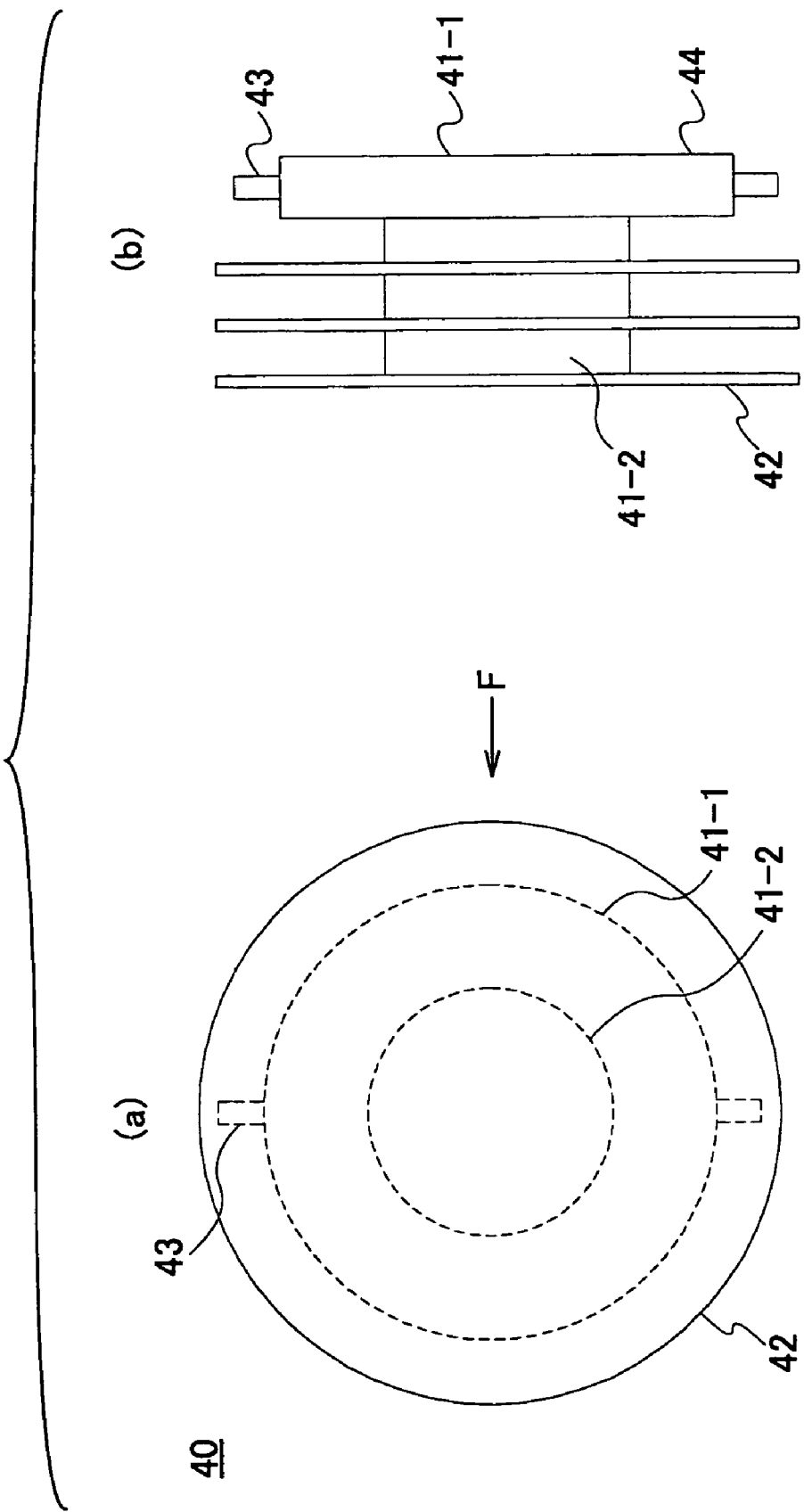
FIG. 5 is a view showing a structure of a radiator 40 shown in FIG. 4.

FIG. 5 is a view showing a structure of the radiator 40 shown in FIG. 4. More specifically, FIG. 5-(a) is a plan view of the radiator 40 and FIG. 5-(b) is a side view of the radiator 40 seen from a direction shown by an arrow F in FIG. 4-(a).

Referring to FIG. 5, the radiator 40 is made of a metal material such as aluminum having a good thermal conductivity. The radiator 40 includes a cylindrical first stud section 41-1, a cylindrical second stud section 41-2 having a circumferential cross-section smaller then a cross-section of the first stud-section 41-1, and a plurality of disk-shaped heat radiating fins 42.

The first stud section 41-1 is provided as a bottom part of the radiator 40. The radiating fins 42 are provided at a side wall part of the second stud section 41-2 provided on the first stud section 41-1 so as to be superposed on each other.

A bottom surface 44 of the first stud section 41-1 functioning as a bottom part of radiator 40 is slightly smaller than a radiator insert hole forming part 53 (See FIG. 6) of the fixing spring metal fitting 50. The bottom surface 44 functions as a surface which adheres to a top surface of the semiconductor device 32. Furthermore, a side wall (side surface) part of the first stud section 41-1 has a cross-sectional configuration the same as a cross section of the bottom surface 44. The side wall (side surface) part of the first stud section 41-1 functions as a guide part which guides the first stud section 41-1 into the radiator insert hole forming part 53 (See FIG. 6).

Two projection parts 43 for engaging are formed on the side wall (side surface) part of the first stud section 41-1 so as to project straight to the outside of the first stud section 41-1 at a cross section of the first stud section 41-1. The projection 43 has a pin-shaped configuration. The projection 43 is formed on the side surface of the first stud section 41-1 by cutting the side surface of the first stud section 41-1 or by forming a hole from the side surface of the first stud section 41-1 toward the center of the first stud section 41-1 and pushing a pin into the hole.

As described below, the radiator 40 is mounted on the fixing spring metal fitting 50 and the projection 43 is engaged with an engaging part 56 (See FIG. 4 and FIG. 6).

Two projection parts 43 are provided in this embodiment. However, the present invention is not limited to this. As long as the number of the projection parts 43 is plural, there is no limitation of the number. The projection parts 43 may be formed on the side surface of the first stud section 41-1 radiantly. However, the number of the projection parts 43 cannot be only one. If only one projection part 43 is provided, when the radiator 40 is mounted on the fixing spring metal fitting 50, the bottom surface 44 of the first stud section 41-1 of the radiator 40 does not evenly come in contact with the electric component such as the semiconductor device which is a subject for radiation.

Figure 6:
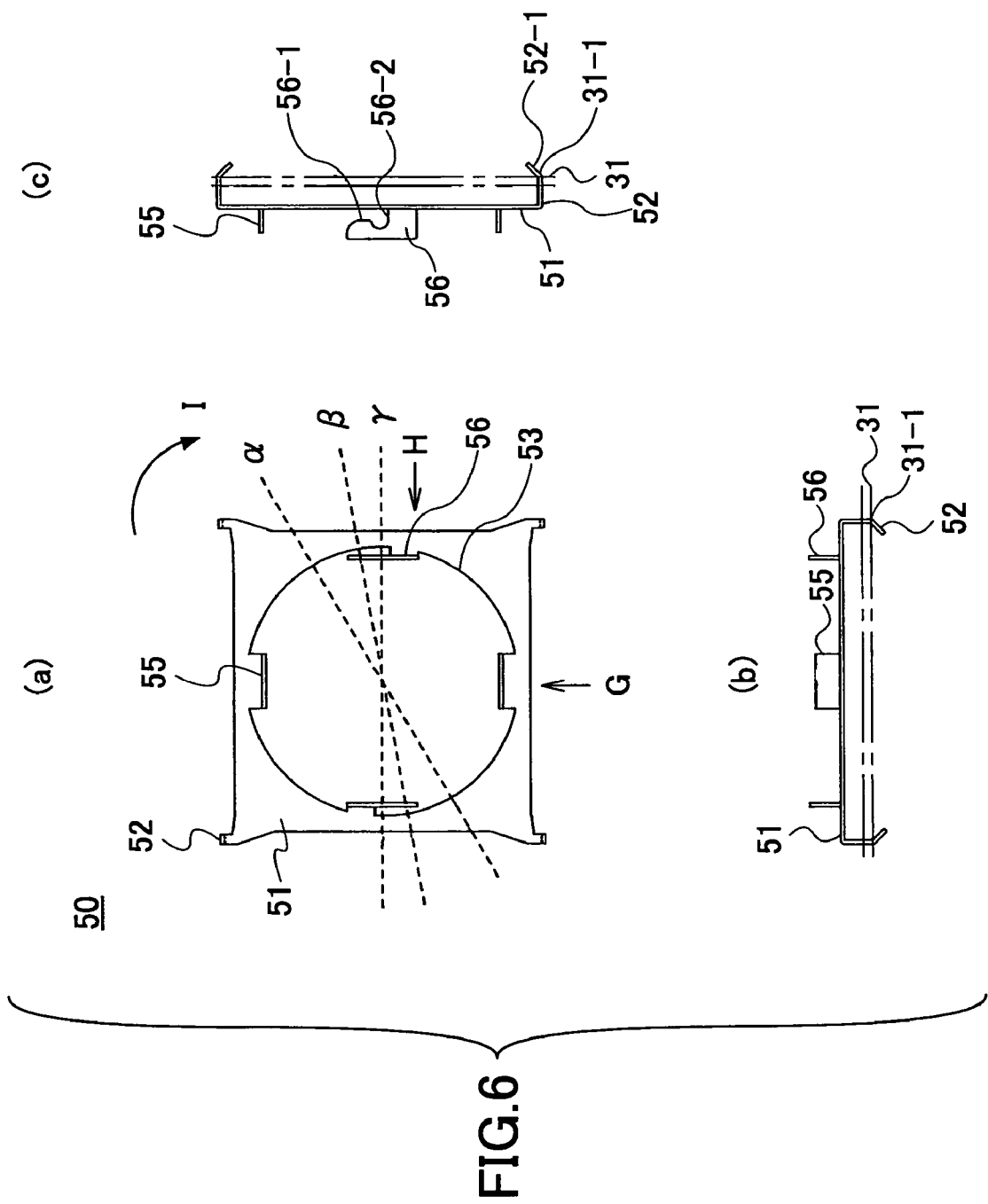
FIG. 6 is a view showing a structure of a fixing spring metal fitting 50 shown in FIG. 4.

FIG. 6 is a view showing a structure of the fixing spring metal fitting 50 shown in FIG. 4. More specifically, FIG. 6-(a) is a plan view of the fixing spring metal fitting 50, FIG. 6-(b) is a side view seen from a direction shown by an arrow G, and FIG. 6-(c) is a side view seen from a direction shown by an arrow H.

Referring to FIG. 6, the fixing spring metal fitting 50 is made of, for example, a metal thin plate spring having a spring property. The fixing spring metal fitting 50 includes a top surface 51 having a substantially square-shaped configuration and four bent pieces 52 which respectively extend from four corners of the top surface 51 and are formed by being bent downward.

The radiator insert hole forming part 53 is provided substantially in the center of the top surface 51. The radiator insert hole forming part 53 has a substantially circular configuration bigger than the circulars configuration surface of the first stud section 41-1 (See FIG. 4 and FIG. 5) and smaller than a circular plate configuration surface of the radiating fin (FIG. 4 and FIG. 5). Thus, the radiator insert hole forming part 53 has a substantially circular configuration in this embodiment. However, the present invention is not limited to this. The radiator insert hole forming part 53 may have a polygonal configuration such as a substantially rectangular configuration, for example.

Two guide parts 55 are extended straight and upward from a circumference of the radiator insert hole forming part 53. A slight gap is formed between the guide part 55 and an exterior circumference of the circular plate configuration surface of the first stud section 41-1 (See FIG. 4 and FIG. 5). As described below, it is necessary to rotate the radiator 40 inside of the radiator insert hole forming part 53 in order to mount the radiator 40 (See FIG. 4 and FIG. 5) on the fixing spring metal fitting 50. The guide part 55 functions as a guide to provide the radiator 40 inside of the radiator insert hole forming part 53 and to smoothly rotate the radiator 40 in a circumferential direction of the radiator insert hole forming part 53. Therefore, it is possible to mount the radiator 40 on the fitting spring metal fitting 50 by the guide part 55.

Two engaging parts 56 are extended straight and upward from a circumference of the radiator insert hole forming part 53 and situated at positions separated by approximately 90 degrees from places where the guide parts 55 are formed. A slight gap is formed between the engaging part 56 and an exterior circumference of the circular plate configuration surface of the first stud section 41-1 (See FIG. 4 and FIG. 5). A cutting part 56-1 is formed in the engaging part 56. A rotation stop part 56-2 having a half circle concave configuration is formed in the depth side of the cutting part 56-1.

The radiator (See FIG. 4 and FIG. 5) is inserted inside of the radiator insert hole forming part 53 and the rotation of the radiator 40 is guided by the guide part 55 and the engaging part 56. The radiator 40 is rotated a designated number of degrees so that the projection part 43 (See FIG. 4 and FIG. 5) projecting to the side wall (side surface) part of the first stud section 41-1 (See FIG. 4 and FIG. 5) of the radiator 40 is engaged and received by the rotation stop part 56-2 of the engaging part 56. As a result of this, the bottom surface 44 (See FIG. 4 and FIG. 5) of the radiator 40 is pushed onto a surface of the top part of the semiconductor device 32. While this state is maintained, the radiator 40 is fixed to the fixing spring metal fitting 50.

Since the rotation stop part 56-2 of the engaging part 56 has a half circle concave configuration, the rotation of the radiator 40 is prevented from being reversed due to application of vibration and thermal stress in this state and the radiator 40 is prevented from dropping off from the fixing spring metal fitting 50. As long as the rotation stop part 56-2 functions to engage with the above-discussed projection part 43, the configuration of the rotation stop part 56-2 of the engaging part 56 is not limited to the half circle concave configuration. The configuration of the rotation stop part 56-2 may be a substantially half rectangular concave configuration, for example.

The four bent pieces 52 extending from the four corners of the top surface part 51 and being bent in a gate shape are inserted into through holes 31-1 (indicated by one-dotted lines in FIG. 4, FIG. 6-(b) and FIG. 6-(c)) of the circuit board 31. The fixing spring metal fitting 50 is provided to the circuit board 31 as straddling the semiconductor device 32 such as the LSI.

A fixing lead part 52-1 extends from an end part of the bent piece 52. The fixing lead part 52-1 is inserted in the through hole 31-1 of the circuit board 31 and bent inward or solder-fixed, so that the fixing spring metal fitting 50 is fixed to the circuit board 31.

Next, an assembly method for rotating and installing the radiator 40 to the fixing spring metal fitting 50 is discussed.

Figure 7:
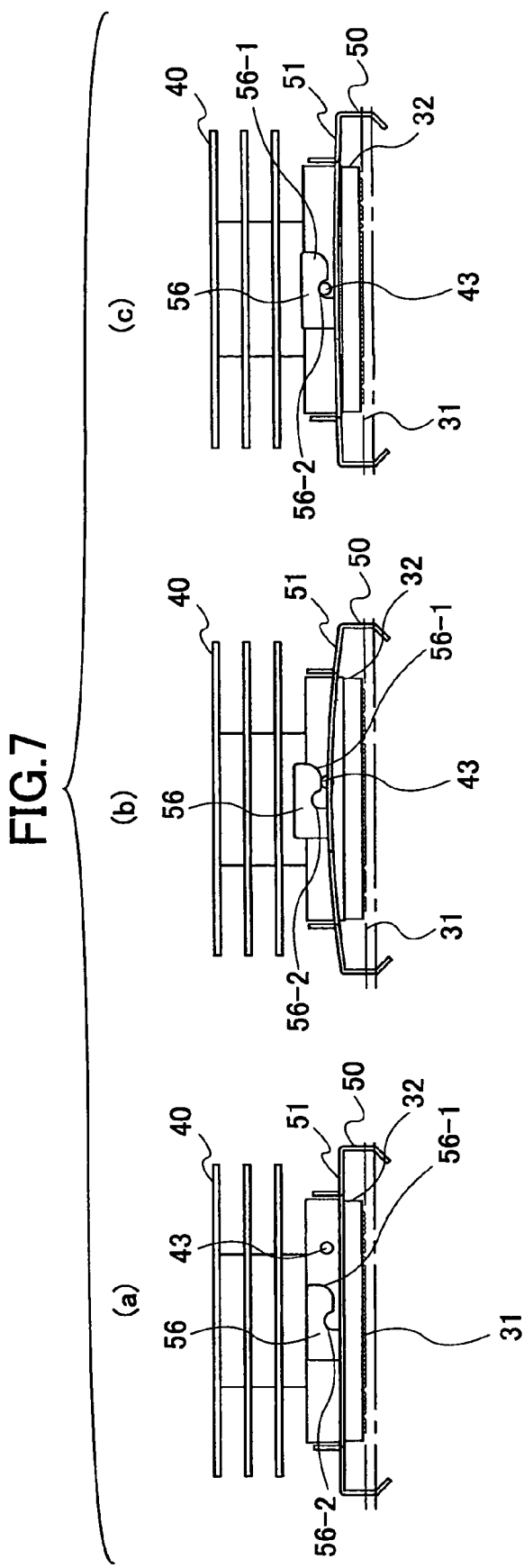
FIG. 7 is a view for explaining an assembly method for rotating and installing the radiator 40 to fixing spring metal fitting 50.

FIG. 7 is a view for explaining the assembly method for rotating and installing the radiator 40 onto the fixing spring metal fitting 50. More specifically, FIG. 7-(a) is a side view of the radiator 40 and the fixing spring metal fitting 50 seen from a direction shown by an arrow H in FIG. 6 in a case where two projection parts 43 are situated on a position shown by a one-dotted line α in FIG. 6. FIG. 7-(b) is a side view of the radiator 40 and the fixing spring metal fitting 50 seen from a direction shown by an arrow H in FIG. 6 in a case where two projection parts 43 are situated on a position shown by a one-dotted line β in FIG. 6. FIG. 7-(c) is a side view of the radiator 40 and the fixing spring metal fitting 50 seen from a direction shown by an arrow H in FIG. 6 in a case where two projection parts 43 are situated on a position shown by a one-dotted line γ in FIG. 6.

Referring to FIG. 7, in a state shown in FIG. 7-(a), the radiator 40 is inserted inside of the radiator insert hole forming part 53. The rotation of the radiator 40 is guided by the guide part 55 and the engaging part 56 so that the projection part 43 is situated on the position shown by a one-dotted line α. At this time, the projection part 43 has not engaged with the engaged part 56 yet.

Results of further rotation of the radiator 40 in the direction shown by an arrow I in FIG. 6 are shown in FIG. 7-(b). In this state shown in FIG. 7-(a), the projection part 43 is situated on the position shown by a one-dotted line β. In this state, the projection part 43 slides on a lower surface of the cutting part 56-1. As shown in FIG. 7-(a), in a state prior to the rotation of the radiator 40, the projection part 43 is situated at a position higher than the lower surface of the cutting part 56-1. Hence, the radiator 40 is rotated so that the projection part 43 is in the cutting part 56-1 as shown in FIG. 7-(b), the top surface 51 of the fixing spring metal fitting 50 where the engaging part 56 extends is pulled upward.

A further rotation of the radiator 40, in a direction shown by an arrow I in the state shown in FIG. 7-(b), results in the state shown in FIG. 7-(c). In the state shown in FIG. 7-(c), the projection part 43 is situated on the position shown by a one-dotted line γ. In this state, the projection part 43 is engaged with and received by the cutting part 56-2 of the engaging part 56. At this time, the rotation of the radiator 40 is stopped and the bottom surface of the radiator 40 is pushed onto the surface of the upper part of the semiconductor device 32. While this state is maintained, the radiator 40 is fixed to the fixing spring metal fitting 50 regardless of the temperature of the semiconductor device 32.

That is, the projection part 43 is moved into a space between the engaging part 56 of the fixing spring metal fitting 50 and a surface of the semiconductor device 32 mounted on the printed wiring board 31, so that a spring elastic force of the fixing spring metal fitting 50 is applied so as to push the projection part 43 provided at the radiator 40 in a direction of the semiconductor device 32 and the stud sections 41-1 and 41-2 of the radiator 40 are pushed onto on the surface of the semiconductor device 32 with a constant pressure. Because of this, as shown in FIG. 7-(c), as compared with a state shown in FIG. 7-(a), a spring bend in a slightly upward direction is formed.

Under this structure, as shown in FIG. 4, the radiator 40 is adhered onto the semiconductor device 32 mounted on the circuit board 31 via the radiator insert hole forming part 53 of the fixing spring metal fitting 50 provided on the circuit board 31. Therefore, regardless of the temperature of the semiconductor device 32, a pushing force is applied to the radiator 40, so that the radiator 40 is pushed in good balance onto the semiconductor device 32 which is an object of radiation, by only a spring elastic force of the fixing spring metal fitting 50. As a result of this, the radiator 40 is securely adhered to the semiconductor device 32 and this state is maintained. Therefore, the bottom surface 44 of the first stud section 41-1 of the radiator 40 comes in even contact with the semiconductor device 32 and thereby it is possible to radiate securely. Hence, it is possible to improve a radiating property of the semiconductor device 32.

Furthermore, since the radiator insert hole forming part 53, namely an opening area of the fixing spring metal fitting 50, can be made large, it is possible to easily check the information indicated on a surface of the semiconductor device 32 by removing the radiator 40.

In addition, the radiator 40 can be attached on and detached from the surface of the upper part of the semiconductor device 32 in a vertical direction of the circuit board 31. Hence, a limitation regarding heights of other electronic components provided in the periphery of the radiator 44 and a setting of an area where the electronic components are provided can be eased. In addition, it is possible to easily attach or detach the radiator 40 under a simple structure without removing the optical fiber or the like provided in the area where the electronic components are provided. Hence, it is possible to reduce design mistakes of the electronic components for the circuit board 31.

Furthermore, the radiator 40 can be engaged with the fixing spring metal fitting 50 provided to the circuit board 31 by rotating the radiator 40, as straddling the semiconductor device 32 mounted on the circuit board 31. Hence, it is possible easily to attach or detach the radiator 40. In addition, since the radiator can be attached on and detached from the semiconductor device 32 mounted on the circuit board 31 by rotating the radiator 40, the semiconductor device 31 and a part soldered on the circuit board 31 are not damaged.

[Second Embodiment]

Next, a second embodiment of the present invention is discussed. In the second embodiment, parts that are the same as the parts discussed in the first embodiment are given the same reference numerals, and explanation thereof will be omitted.

As shown in FIG. 4, FIG. 5 and FIG. 7, the radiator 40, which includes the cylindrical first stud section 41-1, the cylindrical second stud section 41-2 having a circumferential cross section smaller then a cross section of the first stud-section 41-1, and plural disk-shaped heat radiating fins 42, is used in the first embodiment. In the second embodiment, a radiator 140 show in FIG. 8 and FIG. 9 is used instead of the radiator 40.

Figure 8:
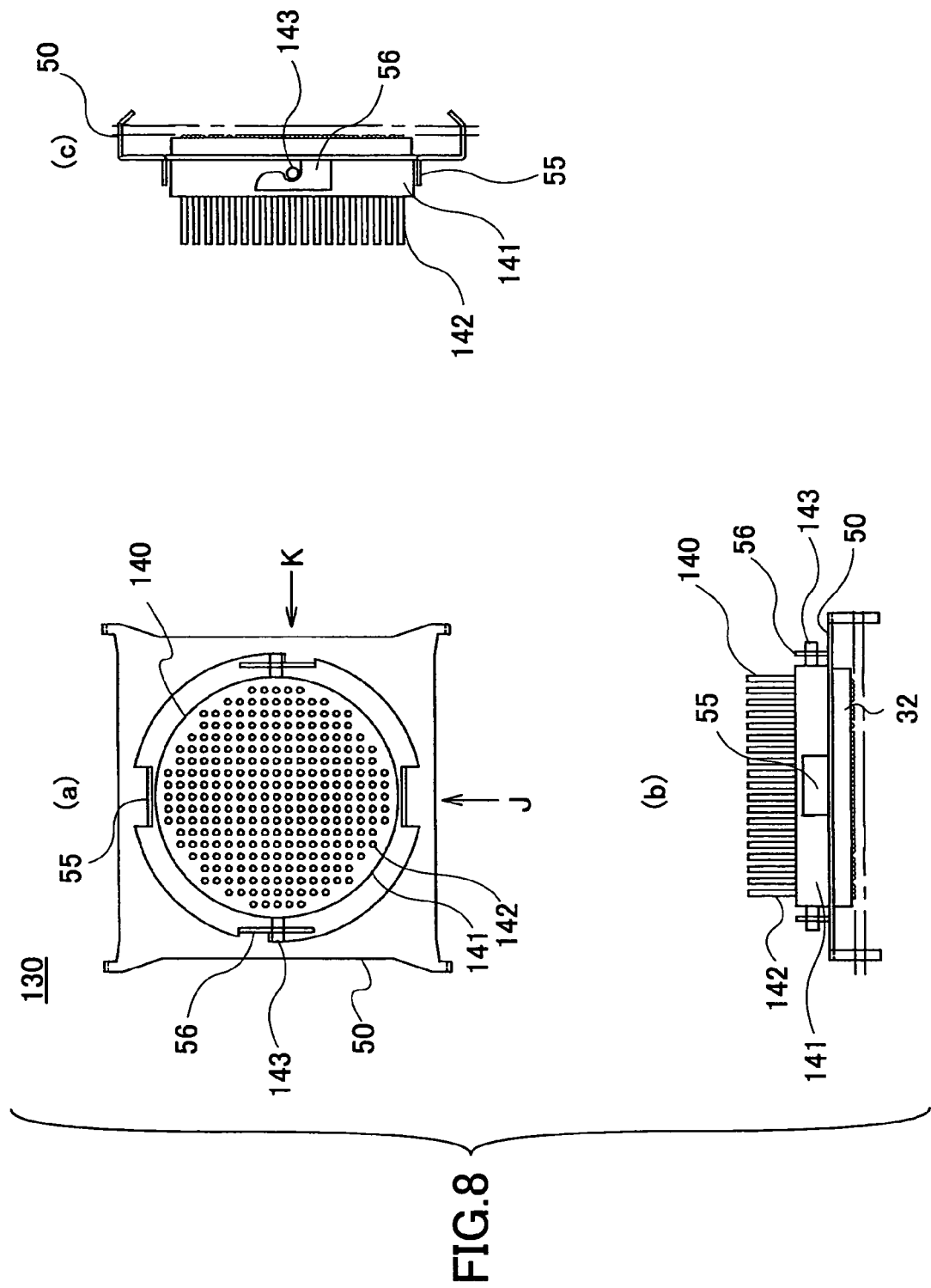
FIG. 8 is a view showing a radiating apparatus 130 of a second embodiment of the present invention.

FIG. 8 is a view showing a radiating apparatus 130 of the second embodiment of the present invention. More specifically, FIG. 8-(a) is a plan view of the radiation apparatus 130, FIG. 8-(b) is a side view seen from a direction shown by an arrow J in FIG. 8-(a), and FIG. 8-(c) is a side view seen from a direction shown by an arrow K in FIG. 8-(a).

Referring to FIG. 8, the radiating apparatus 130 of the second embodiment includes the radiator 140 and the fixing spring metal fitting 50 used in the first embodiment. The radiator 140 is mounted on the fixing spring metal fitting 50.

Figure 9:
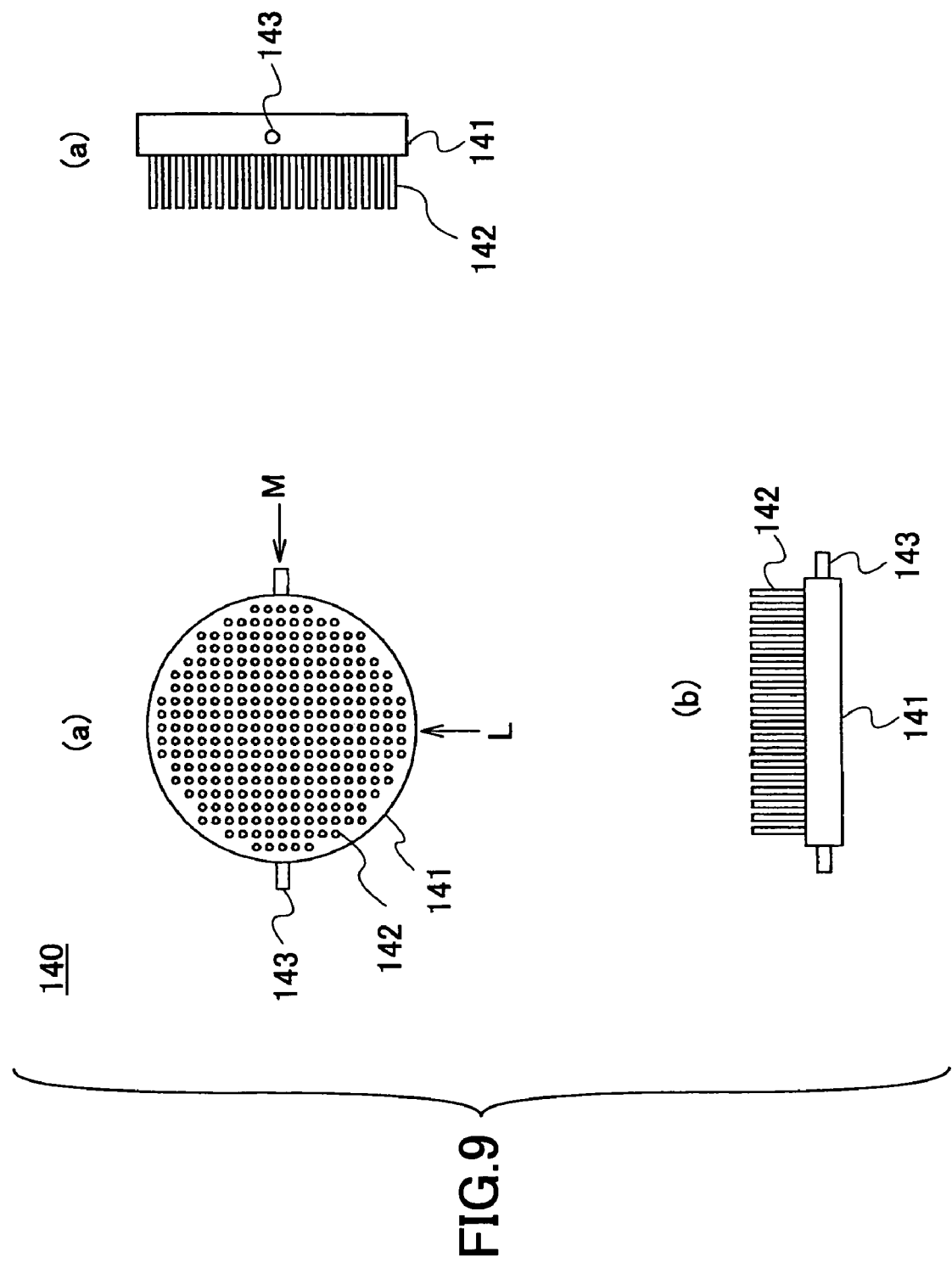
FIG. 9 is a view showing a structure of a radiator 140 shown in FIG. 8.

FIG. 9 is a view showing the structure of the radiator 140 shown in FIG. 9. More specifically, FIG. 9-(a) is a plan view of the radiator 140, FIG. 9-(b) is a side view of the radiator 140 seen from a direction shown by an arrow L in FIG. 9-(a), and FIG. 9-(c) is a side view of the radiator 140 seen from a direction shown by an arrow M in FIG. 9-(a).

Referring to FIG. 9, the radiator 140 of the radiating apparatus 130 of the second embodiment includes a cylindrical stud section 141 and plural radiating projection parts 142 formed on the upper surface of the stud section 141. The stud section 141 is provided as a bottom part of the radiator 140. The radiating projection parts are formed on the upper surface of the stud part 141 in a vertical direction in a spike shape with substantially equal gaps.

As well as in the first embodiment, two projection parts 143 for engaging are formed on the side wall (side surface) part of the first stud section 141 so as to straight project to an outside of the first stud section 141 at a cross section of the first stud section 141.

Referring to FIG. 8, as well as in the first embodiment, the projection part 143 is engaged with the engaging part 56 by providing the radiator 140 to the fixing spring metal fitting 50. The same effect as the effect in the first embodiment can be achieved in the second embodiment.

Figure 10:
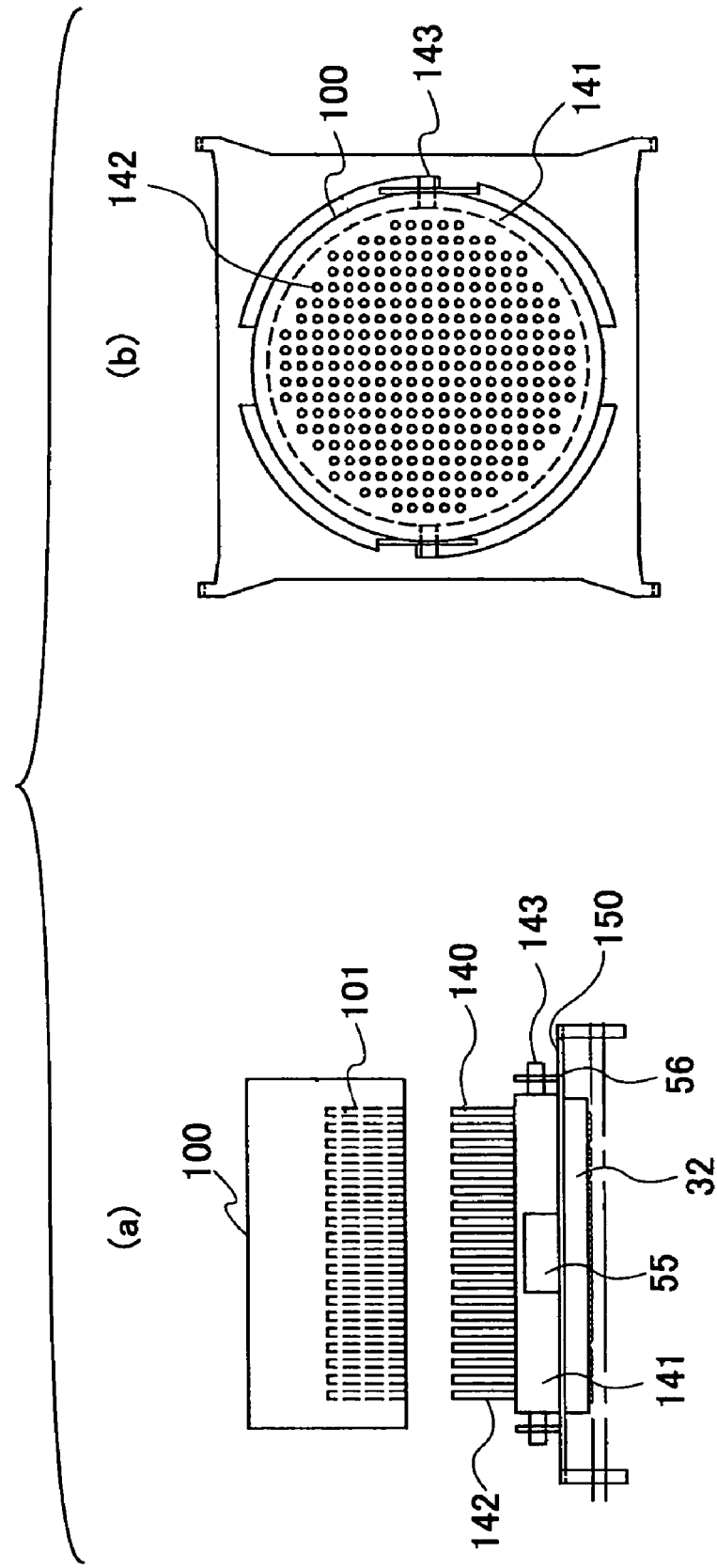
FIG. 10 is a view showing an adaptor member 100 assisting a rotational move of the radiator 140 shown in FIG. 9.

Meanwhile, FIG. 10 is a view showing an adaptor member 100 assisting a rotational move of the radiator 140 shown in FIG. 9. More specifically, FIG. 10-(a) shows a state prior to the engagement of the adaptor member 100 with the radiator 140, and FIG. 10-(b) is a perspective view showing a state where the adaptor member 100 is engaged with the radiator 140.

Plural radiation projection receiving hole forming parts 101 are formed with gaps substantially the same as the gap of radiation project parts 142 inside of the columnar adaptor member 100. The radiation projection receiving hole forming parts 101 have cross sections larger than cross sections of the radiation projection parts 142 provided in the spike shape on the upper surface of the stud section 141 with substantially same gaps.

In order to provide the radiator 140 on the fixing spring metal fitting 50, the radiator 140 should be covered with the adaptor member 100. Then, the radiation projection part 142 of the radiator 140 is inserted in and engaged with the radiation projection receiving hole forming parts 101 of the adaptor member 100. Next, the operator rotates the adaptor member 100 by manual effort so that the projection part 143 is engaged with the engaging part 56. After that, the adaptor member 100 is removed.

The adaptor member 100 is engaged with the radiator 140 so that it is possible to easily rotate the radiator 140.

[Third Embodiment]

Next, a third embodiment of the present invention is discussed. In the third embodiment, parts that are the same as the parts discussed in the first embodiment are given the same reference numerals, and explanation thereof will be omitted.

As shown in FIG. 6, in the first and second embodiments, two guide parts 55 of the fixing spring metal fitting 50 are extended straight and upward from a circumference of the radiator insert hole forming part 53. In addition, in the first and second embodiments, two engaging parts 56 of the fixing spring metal fitting 50 are extended straight and upward from a circumference of the radiator insert hole forming part 53 and situated at positions separated by approximately 90 degrees from places where the guide parts 55 are formed. In the third embodiment, a fixing spring metal fitting 150 show in FIG. 11 and FIG. 12 is used instead of the fixing spring metal fitting 50.

Figure 11:
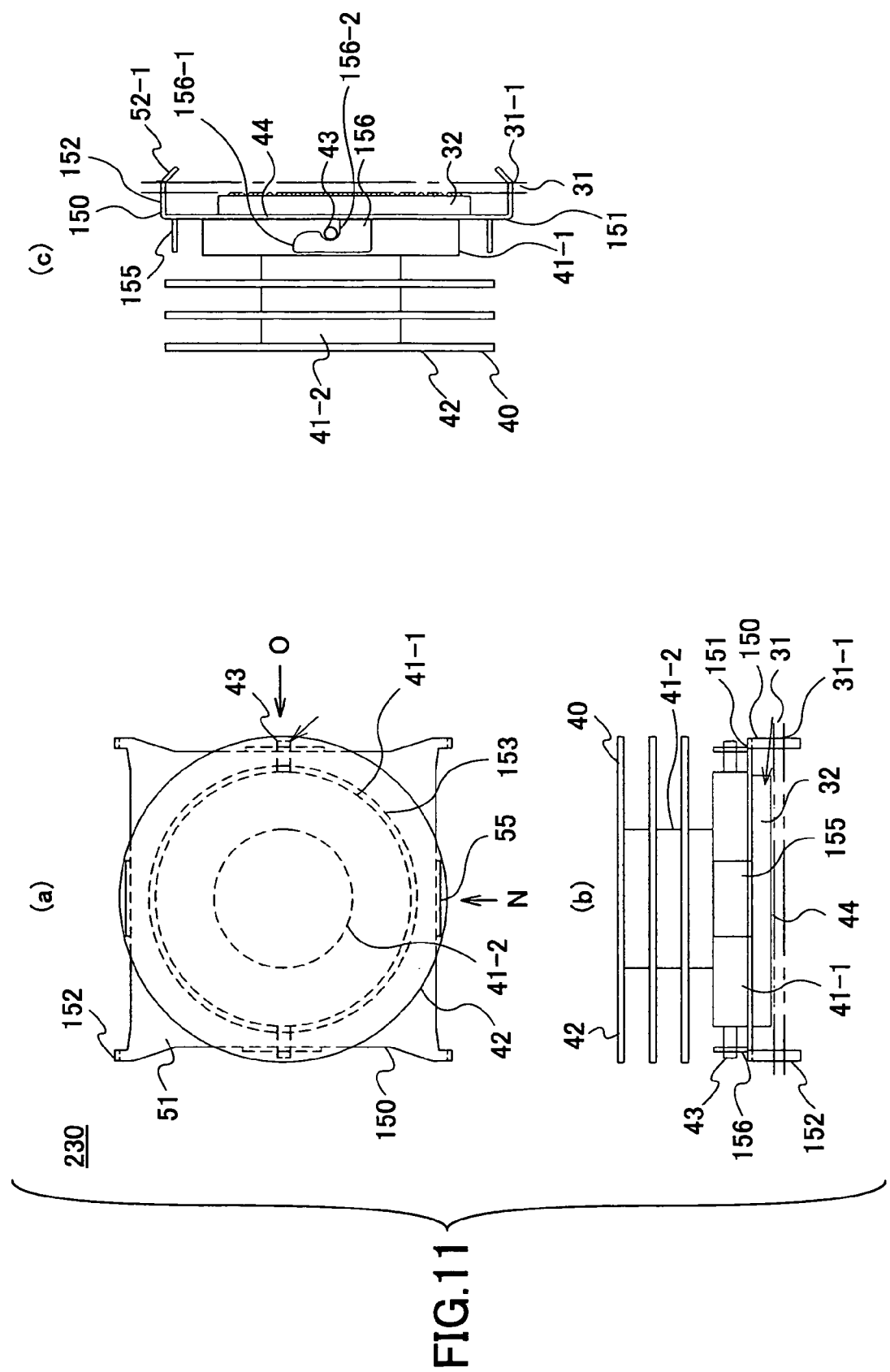
FIG. 11 is a view showing a radiating apparatus 230 of a third embodiment of the present invention.

FIG. 11 is a view showing a radiating apparatus 230 of the third embodiment of the present invention. More specifically, FIG. 11-(a) is a plan view of the radiation apparatus 230, FIG. 11-(b) is a side view seen from a direction shown by an arrow N in FIG. 11-(b), and FIG. 11-(c) is a side view seen from a direction shown by an arrow O in FIG. 11-(c).

Referring to FIG. 11, the radiating apparatus 230 of the third embodiment includes the radiator 40 used in the first embodiment and the fixing spring metal fitting 150. The radiator 40 is mounted on the fixing spring metal fitting 150.

FIG. 12 is a view showing a structure of the fixing spring metal fitting 150 shown in FIG. 11. More specifically, FIG. 12-(a) is a plan view of the fixing spring metal fitting 150, and FIG. 12-(b) is a side view seen from a direction shown by an arrow P in FIG. 12-(a).

Referring to FIG. 12, the fixing spring metal fitting 150 is made of, for example, a metal thin plate spring having a spring property. The fixing spring metal fitting 150 includes a top surface 151 having a substantially square-shaped configuration and four bent pieces 152 which respectively extend from four corners of the top surface 151 and are formed by being bent downward.

The radiator insert hole forming part 153 is provided in the substantially center of the top surface 51. The radiator insert hole forming part 153 has a substantially circular configuration bigger than the circular configuration surface of the first stud section 41-1 (See FIG. 4 and FIG. 5) and smaller than the circular plate configuration surface of the radiating fin 42 (See FIG. 4 and FIG. 5). Thus, the radiator insert hole forming part 153 has a substantially circular configuration in this embodiment. However, the present invention is not limited to this. The radiator insert hole forming part 153 may have a polygonal configuration such as a substantially rectangular configuration, for example.

Two guide parts 155 are extended straight and upward from substantially the centers of two sides of the four side forming external edge part, namely an external circumference of the top surface 151. A designated gap is formed between the guide part 155 and an exterior circumference of the circular plate configuration surface of the first stud section 141-1. The guide part 155 functions as a guide as well as the guide part in the first and second embodiments.

Two engaging parts 156 are extended straight and upward from substantially the centers of two sides where the guide parts are not provided of the four side forming external edge part, namely an external circumference of the top surface 151. A designated gap is formed between the engaging part 156 and an exterior circumference of the circular plate configuration surface of the first stud section 41-1. A cutting part 156-1 is formed in the engaging part 156. A rotation stop part 156-2 having a half circle concave configuration is formed in the depth side of the cutting part 156-1.

As well as in the first embodiment, the radiator 40 is inserted inside of the radiator insert hole forming part 153 and the rotation of the radiator 40 is guided by the guide part 155 and the engaging part 156.

The radiator 40 is rotated a designated number of degrees, so that the projection part 43 projecting to the side wall (side surface) part of the first stud section 41-1 of the radiator 40 is engaged and received by the rotation stop part 156-2 and therefore the rotation of the radiator 40 is stopped. As a result of this, the bottom surface 44 of the radiator 40 is pushed onto a surface of the top part of the semiconductor device 32. While this state is maintained, the radiator 40 is fixed to the fixing spring metal fitting 50.

Since the rotation stop part 156-2 of the engaging part 156 has a half circle concave configuration, the rotation of the radiator 40 is prevented from being reversed due to application of vibration and thermal stress in this state and the radiator 40 is prevented from dropping off from the fixing spring metal fitting 150. As long as the rotation stop part 156-2 functions to engage with the above-discussed projection part 43, the configuration of the rotation stop part 156-2 of the engaging part 156 is not limited to the half circle concave configuration. The configuration of the rotation stop part 156-2 may be a substantially half rectangular concave configuration, for example.

Four bent pieces 52 extending from corresponding four corners of the top surface part 151 and being bent in a gate shape are inserted into through holes 31-1 (indicated by one-dotted lines in FIG. 11 and FIG. 12) of the circuit board 31. The fixing spring metal fitting 150 is provided to the circuit board 31 as straddling the semiconductor device 32 such as the LSI.

Under this structure, the same effect achieved in the first embodiment can be achieved in the third embodiment.

[Fourth Embodiment]

Next, a fourth embodiment of the present invention is discussed. In the fourth embodiment, parts that are the same as the parts discussed in the first embodiment are given the same reference numerals, and explanation thereof will be omitted.

Figure 13:
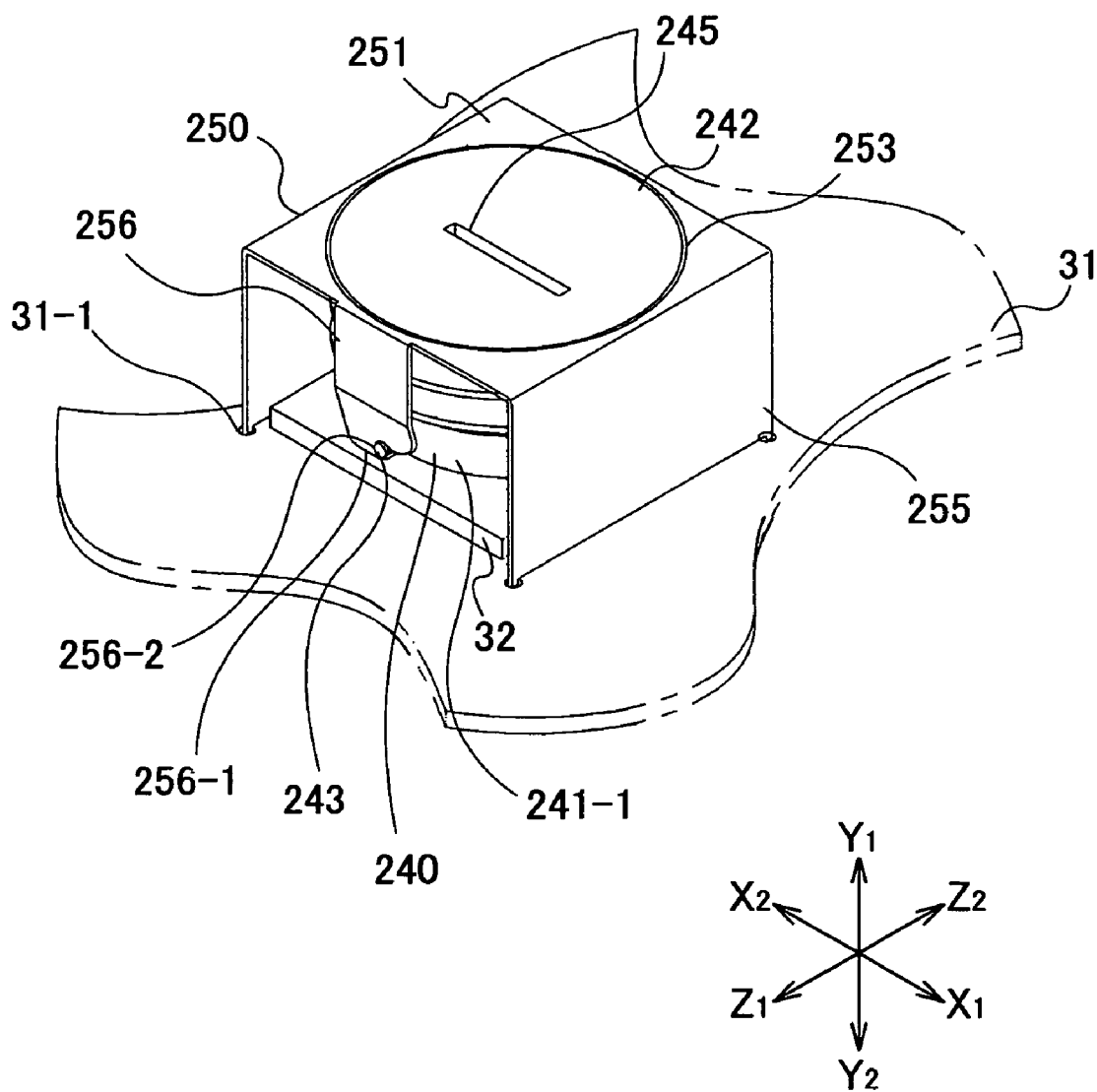
FIG. 13 is a perspective view of a radiating apparatus 330 of a fourth embodiment of the present invention.

FIG. 13 is a perspective view of a radiating apparatus 330 of a fourth embodiment. Referring to FIG. 13, the radiating apparatus 330 of the fourth embodiment includes a radiator 240 and a fixing spring metal fitting 250. The radiator 240 is mounted on the fixing spring metal fitting 250.

Figure 14:
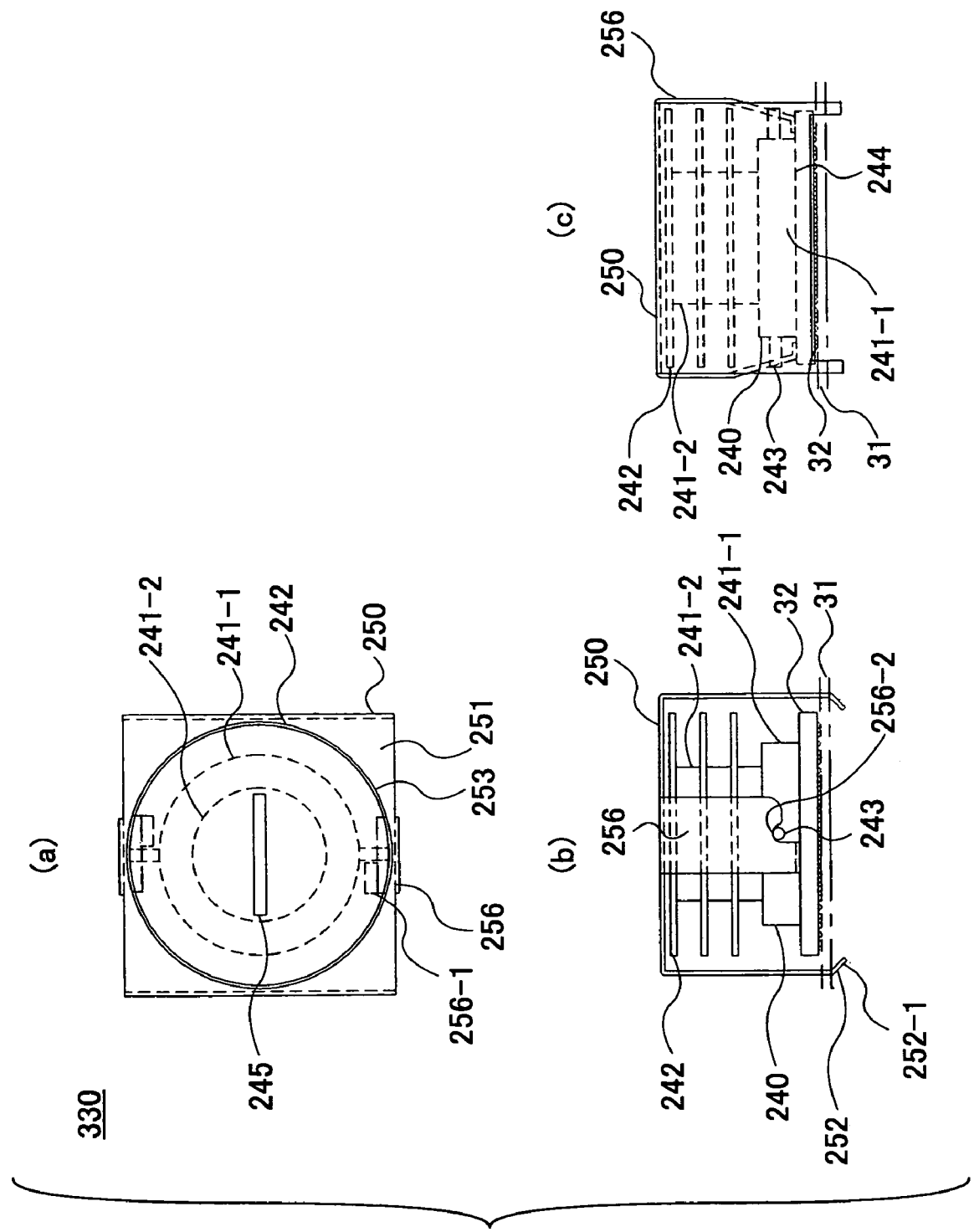
FIG. 14 is a view showing a structure of the radiating apparatus 330 shown in FIG. 13.

FIG. 14 is a view showing a structure of a radiating apparatus 330 shown in FIG. 13. An assembling structure of the radiator 240 to the fixing spring metal fitting 250 is discussed below.

Figure 15:
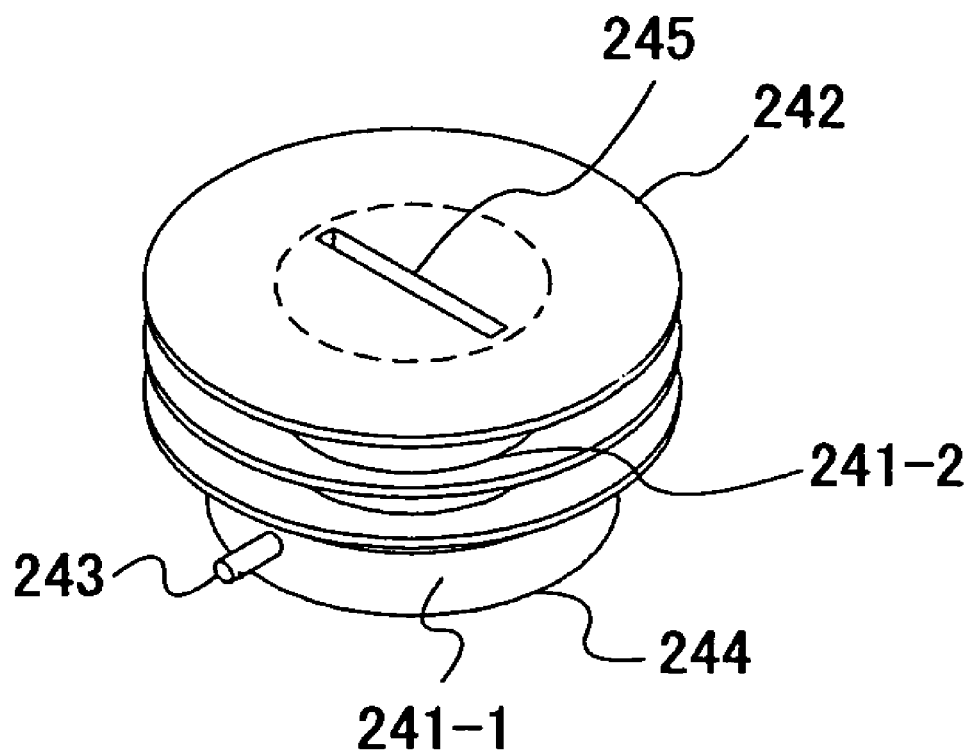
FIG. 15 is a perspective view of a radiator 240 shown in FIG. 13.

FIG. 15 is a perspective view of the radiator 240 shown in FIG. 13. Referring to FIG. 15, the radiator 240 is made of a metal material such as aluminum having good thermal conductivity. The radiator 240 includes a cylindrical first stud section 241-1, a cylindrical second stud section 241-2 having a circumferential cross section smaller than a cross section of the first stud-section 241-1, and a plurality of disk-shaped heat radiating fins 242.

The first stud section 241-1 is provided as a bottom part of the radiator 240 and has a bottom surface 244 as a lower surface. The second stud section 241-2 is provided on the first stud section 241-1. The radiating fins 242 are provided at a side wall part of the second stud section 241-2 so as to be superposed on each other.

Two projection parts 243 for engaging are formed on the side wall (side surface) part of the first stud section 241-1 so as to project straight to an outside of the first stud section 241-1 at a cross section of the first stud section 241-1. The projection 243 has a pin-shaped configuration. As described below, the radiator 240 is mounted on the fixing spring metal fitting 250 and the projection 243 is engaged with an engaging part 256 (See FIG. 13, FIG. 14, and FIG. 16).

The radiator 240 of the radiating apparatus 230 of the fourth embodiment is different from the radiator 40 of the radiating apparatus 30 of the first embodiment in the following points. That is, a slit forming part 245 is formed on a substantially center part of the top surface of the radiation fins 242 situated at a most-top part of the radiator 240. The slit forming part 245 is slightly shorter than the diameter of a circular shaped cross section of the second stud section 41-2 shown by a dotted line in FIG. 15.

Therefore, it is possible to put a coin, driver (not shown), or the like into the slit forming part 245, take the coin, driver, or the like with the operator's finger, and rotate the radiator 240.

FIG. 16 is a view showing a structure of the fixing spring metal fitting 250 shown in FIG. 13. More specifically, FIG. 16-(*a*) is a perspective view of the fixing spring metal fitting 250 and FIG. 16-(*b*) is a plan view seen from a Y1–Y2 direction in FIG. 16-(*a*).

Referring to FIG. 16, the fixing spring metal fitting 250 is made of, for example, a metal thin plate spring having a spring property. The fixing spring metal fitting 250 includes a top surface 251 having a substantially square-shaped configuration, guide parts 255, and engaging parts 256.

The guide parts 255 are extended vertically and downward (in the Y2 direction in FIG. 16) from entire two sides facing each other of the four side forming external edge part of the top surface 251.

Two engaging parts 256 are extended downward (in the Y2 direction in FIG. 16) from substantially centers of two sides where the guide parts 255 are not provided of the four side forming external edge part, namely an external circumference of the top surface 151. Because of the top surface 251 and two guide parts 255, the fixing spring metal fitting 250 has a substantially gate shaped external configuration.

The bent pieces 252 are bent inside at corners of end parts of the guide part 255. A fixing lead part 252-1 extends from an end part of the bent piece 252. The fixing lead part 252-1 is bent inward or solder-fixed, so that the fixing spring metal fitting 250 is fixed to the circuit board 31. The fixing spring metal fitting 250 is provided to the circuit board 31 as straddling the semiconductor device 32 such as the LSI.

A radiator insert hole forming part 253 is provided substantially in the center of the top surface 251. The radiator insert hole forming part 253 has a substantially circular configuration bigger than the circular configuration surface of the radiating fin 242 (FIG. 15). Thus, the radiator insert hole forming part 53 has a substantially circular configuration in this embodiment. However, the present invention is not limited to this. The radiator insert hole forming part 253 may have a polygonal configuration such as a substantially rectangular configuration, for example.

The guide part 255 functions, as well as the guide part 55 of the radiating apparatus 30 of the first embodiment, as a guide to provides the radiator 240 inside of the radiator insert hole forming part 253 and to smoothly rotate it in a circumferential direction of the radiator insert hole forming part 253. Therefore, it is possible to mount the radiator 240 on the fitting spring metal fitting 250 by the guide part 255. The length of the guide part 255 in the Y1–Y2 direction in FIG. 16 is substantially equal to, as shown in FIG. 13, the sum of the length of the semiconductor device 32 in the Y1–Y2 direction in FIG. 16 and the length of the radiator 240 in the Y1–Y2 direction in FIG. 16. Therefore, the radiator 240 is mounted on the fixing spring metal fitting 250 so that the top surface of the fixing spring metal fitting 250 is positioned at a height substantially the same as the height of the upper surface of the radiation fins 242 situated top-most of the radiator 240.

Two engaging parts 256 are extended downward, namely in the Y2 direction in FIG. 16, from substantially centers of two sides where the guide parts 255 are not provided of four sides of the top surface 251 to a part where the radiation fin 42 is positioned. The engaging part 256 is extended to the vicinity of the top surface of the semiconductor device 32 (See FIG. 13) so as to slightly bend inward, namely in the Z1 or Z2 direction in FIG. 16, from a part where the radiation fin 42 is positioned lowest.

In the engaging part 256, a rotation stop part 256-2 having a half circle concave configuration is formed at a part formed so as to slightly bend inward (in Z1 or Z2 direction) from a part where the lowest radiation fin 242 is positioned in the vicinity of the top surface of the semiconductor device 32 (See FIG. 13). The rotation stop part 256-2 functions as a stopper to receive a projection part 243 projecting from a side wall (side surface) of the first stud section 241-1 so that the rotation of the radiator 240 stops.

The engaging part 256 includes an adjust part 256-1. As shown in FIG. 16, the adjust part 256-1 is formed in the vicinity of the top surface of the semiconductor device 32 (See FIG. 13) and extends in parallel with (in the Z1 or Z2 direction) the top surface of the semiconductor device 32 (See FIG. 13). As discussed below, the adjust part 256-1 makes a pushing force whereby the bottom surface of the radiator 240 pushes the top surface of the semiconductor device 32 constantly when the radiator 240 is provided on the fixing spring metal fitting 250.

Next, an assembly method for rotating and installing the radiator 240 onto the fixing spring metal fitting 250 is discussed.

FIG. 14 is a view showing a structure of the radiating apparatus 330 shown in FIG. 13. More specifically, FIG. 14-(a) is a plan view seen in the Y1–Y2 direction in FIG. 13, FIG. 14-(b) is a side view seen in the Z1-Z2 direction in FIG. 13, and FIG. 14-(c) is a side view seen in the X1–X2 direction in FIG. 13.

Referring to FIG. 13 and FIG. 14, the radiator 240 is inserted inside of the radiator insert hole forming part 253, the operator puts a coin, driver (not shown), or the like into the slit forming part 245 and takes the coin, driver, or the like with the operator's finger so as to rotate the radiator 240 through a designated number of degrees. The rotation of the radiator 240 is guided by the guide part 255 and the engaging part 256.

The projection part 243 projecting to the side wall (side surface) part of the first stud section 241-1 of the radiator 240 is engaged and received by the rotation stop part 256-2 of the engaging part 256. As a result of this, the bottom surface 244 of the radiator 240 is pushed onto the top surface of the semiconductor device 232. While this state is maintained, the radiator 240 is fixed to the fixing spring metal fitting 250. Thus, the heat generated by the semiconductor device 32 is conducted to the radiator 240 so that the semiconductor device 32 can be cooled.

The coefficient of thermal conductivity between the semiconductor device 32 and the radiator 240 changes based on a surface situation, a material, and a pushing force, of the top surface of the semiconductor device 32 and the bottom surface 244 of the radiator 240. The coefficient of thermal conductivity between the semiconductor device 32 and the radiator 240 changes with the degree of adhesion between the radiator 240 and the semiconductor device 32 caused by the fixing spring metal fitting 250. Hence, in order to secure a constant radiation property by the radiator 240, it is necessary to make the above-mentioned parameters constant.

For example, in a case where the height of the semiconductor device 32 is shorter than expected due to a component dimensional tolerance or where a separating from the surface of the circuit board 31 generated at the time of soldering of the fixing spring metal fitting 250 becomes large, a gap between the top surface of the semiconductor device 32 and the fixing spring metal fitting 250 become larger than a designated measurement. As a result of this, the pushing force applied to the radiator 240 becomes smaller so that the radiation property becomes degraded.

In addition, in a case where the height of the semiconductor device 32 is greater than expected due to component dimensional tolerance or where separating from the surface of the circuit board 31 generated at the time of soldering of the fixing spring metal fitting 250 becomes small, the gap between the top surface of the semiconductor device 32 and the fixing spring metal fitting 250 become smaller than a designated measurement. As a result of this, the pushing force applied to the radiator 240 becomes too much. Because of this, the semiconductor device 32 may be damaged or the circuit board 31 provided just under the semiconductor device 32 may be bent downward in a convex shape so that the semiconductor device 32 may be pealed off from a foot print of a surface of the circuit board 31 where the semiconductor device 32 is fixed.

However, in this embodiment, because of the adjust part 256-1, measurement precision between a bending part contacting the top surface of the semiconductor device 32 positioned at the head end of the adjust part 256-1 and the upper surface of the rotation stop part 256-2 can be achieved so that a relative position between the top surface of the semiconductor device 32 and the radiator 240 can be made constant. As a result of this, the pushing force of the radiator 240 on the top surface of the semiconductor device 32 can be maintained constant, and thereby it is possible to avoid dispersion of the radiation property and make the radiation property constant.

Since the rotation stop part 256-2 of the engaging part 256 has a half circle concave configuration, the rotation of the radiator 240 is prevented from being reversed due to application of vibration and thermal stress in this state and the radiator 40 is prevented from dropping off from the fixing spring metal fitting 250. As long as the rotation stop part 256-2 functions in engaging the above-discussed projection part 43, the configuration of the rotation stop part 256-2 of the engaging part 256 is not limited to the half circle concave configuration. The configuration of the rotation stop part 256-2 may be a substantially half rectangular concave configuration, for example.

In addition, in this embodiment, the top surface part 251 of the fixing spring metal fitting 250 is situated at substantially the same height as the position of the top surface of the radiation fin 242 situated at the top-most of the radiator 240. Furthermore, the guide part 255 and the engaging part 256 are formed in a direction from the tops surface 251 of the fixing spring metal fitting 250 to a position of the circuit board 31. Therefore, the radiator 240 and the surroundings of the radiator 240 are covered with the entire fixing spring metal fitting 250.

Accordingly, as well as in the first through third embodiments, since the radiator 240 and the fixing spring metal fitting 250 are engaged by the projection parts 243 as a contact points, the heat is conducted from the radiation fins 242 to only projection parts 243 so that heat transfer to the entire fixing spring metal fitting 250 is prevented. Therefore, even if the radiator 240 and an optical fiber or cable provided surrounding the fixing spring metal fitting 250 covering the surroundings of the radiator 240 come in contact with the fixing spring metal fitting 250, the heat generated from the radiator 240 is prevented from being conducted to the optical fiber or the cable via the fixing spring metal fitting 250. That is, by the fixing spring metal fitting 250 having a function to protect the optical fiber, the cable or the like, it is possible to prevent damage of the optical fiber, the cable, or the like due to direct contact with the radiator 240 during operation of the electronic device and the heat from the radiator 240.

Furthermore, the same effect as the effect in the first embodiment can be achieved in the fourth embodiment.

The present invention is not limited to these embodiments, but variations and modifications may be made without departing from the scope of the present invention.

What is claimed is:

1. A heat radiating apparatus, comprising:
   a radiator adhering to an electronic component mounted on a circuit board via an elastic member provided on the circuit board so that the electronic component is cooled;
   wherein the radiator includes a plurality of projection parts,
   the elastic member includes an engaging part configured to engage one or more of the plurality of projection parts and a radiator insert hole forming part where the radiator is inserted,
   the engaging part is provided so as to be substantially perpendicular to the radiator insert hole forming part; and
   a pushing force is applied from the elastic member to the radiator by rotating the radiator so that the one or more projection parts are engaged by the engaging part, and thereby a bottom surface of the radiator is adhered to the electronic component.

2. The heat radiating apparatus as claimed in claim 1, wherein the engaging part is provided along the circumference of the radiator insert hole forming part and substantially perpendicular to the radiator insert hole forming part.

3. The heat radiating apparatus as claimed in claim 1, wherein the engaging part is provided at an external edge part of a surface where the radiator insert hole forming part is provided and substantially perpendicular to the radiator insert hole forming part.

4. The heat radiating apparatus as claimed in claim 1, wherein the engaging part includes a rotation stop part formed in a concave shape, and
   the rotation of the radiator is stopped by receipt of the one or more projection parts of the radiator by the rotation stop part.

5. The heat radiating apparatus as claimed in claim 1, wherein the radiator includes a bottom part, and
   the one or more projection parts are formed on a side surface of the bottom part.

6. The heat radiating apparatus as claimed in claim 5, wherein the radiator includes radiating fins provided on an upper part of the bottom part so as to be superposed on each other.

7. The heat radiating apparatus as claimed in claim 5, wherein the radiator includes a plurality of radiation projection parts formed on an upper part of the bottom part in a spike shape.

8. The heat radiating apparatus as claimed in claim 7, further comprising:
   an adaptor member in which radiation projection receiving hole forming parts configured to receive the plurality of radiation projection parts are provided.

9. The heat radiating apparatus as claimed in claim 1, wherein the elastic member further includes a guide pan configured to guide the rotation of the radiator inside the radiator inside hole forming pan.

10. The heat radiating apparatus as claimed in claim 1, wherein the radiator insert hole forming part of the elastic member is situated at the substantially same height as a position of the top surface of the radiator,
    the elastic member further includes a guide part configured to guide the rotation of the radiator inside the radiator insert hole forming part, and
    the guide part and the engaging part are formed at an external edge part of a surface where the radiator insert hole forming part is provided and in a direction to a position of the circuit board.

11. The heat radiating apparatus as claimed in claim 10, wherein the engaging part includes an adjust part configured to make the pushing force whereby a bottom surface of the radiator pushes a top surface of the electronic component substantially constant.

12. The heat radiating apparatus as claimed in claim 1, wherein the elastic member includes bent pieces which are bent in a gate shape to be inserted into through holes formed in the circuit board, and
    the elastic member is fixed to the circuit board so as to straddle the electronic component provided to the circuit board.

* * * * *